(12) United States Patent
Delaney et al.

(10) Patent No.: US 10,521,305 B2
(45) Date of Patent: Dec. 31, 2019

(54) HOLDUP TIME MEASUREMENT FOR SOLID STATE DRIVES

(71) Applicant: Toshiba Memory Corporation, Minato-ku, Tokyo (JP)

(72) Inventors: Christopher Delaney, Orange, CA (US); Leland Thompson, Tustin, CA (US); John Hamilton, Boulder, CO (US); Gordon Waidhofer, Irvine, CA (US); Ali Aiouaz, San Jose, CA (US)

(73) Assignee: Toshiba Memory Corporation, Tokyo (JP)

( * ) Notice: Subject to any disclaimer, the term of this patent is extended or adjusted under 35 U.S.C. 154(b) by 350 days.

(21) Appl. No.: 15/142,937

(22) Filed: Apr. 29, 2016

(65) Prior Publication Data

US 2017/0315889 A1 Nov. 2, 2017

(51) Int. Cl.
| | | |
|---|---|---|
| *G06F 1/30* | (2006.01) | |
| *G06F 11/14* | (2006.01) | |
| *G11C 5/14* | (2006.01) | |
| *G06F 1/28* | (2006.01) | |
| *G06F 3/06* | (2006.01) | |
| *G06F 11/34* | (2006.01) | |
| *H02M 1/00* | (2006.01) | |

(Continued)

(52) U.S. Cl.
CPC .......... *G06F 11/1441* (2013.01); *G06F 1/30* (2013.01); *G06F 1/263* (2013.01); *G06F 1/28* (2013.01); *G06F 3/0619* (2013.01); *G06F 3/0625* (2013.01); *G06F 11/2015* (2013.01); *G06F 11/3419* (2013.01); *G11C 5/148* (2013.01); *H02M 2001/0032* (2013.01)

(58) Field of Classification Search
CPC ............ G11C 5/148; G06F 2212/7207; G06F 3/0619; G06F 3/0625; G06F 3/0647; G06F 3/065; G06F 11/3419; G06F 1/263; G06F 1/28; G06F 1/30; G01R 31/392; H02M 2001/0032
See application file for complete search history.

(56) References Cited

U.S. PATENT DOCUMENTS

| | | |
|---|---|---|
| 4,742,424 A | 5/1988 | Kautzer et al. |
| 5,347,191 A | 9/1994 | Wood |

(Continued)

OTHER PUBLICATIONS

Mathematical Treatment of Charging and Discharging a Capacitor by SchoolPhysics historical version, archived Mar. 9, 2015 http://www.schoolphysics.co.uk/age16-19/Electricity%20and%20magnetism/Electrostatics/text/Capacitor_charge_and_discharge_mathematics/index.html (Year: 2015).*

(Continued)

*Primary Examiner* — Joseph O Schell
(74) *Attorney, Agent, or Firm* — White & Case LLP

(57) ABSTRACT

In one embodiment, a solid state drive (SSD) with power loss protection (PLP) includes a SSD controller, a secondary controller and a power circuit configured to supply power to the SSD from a power source during normal operation and backup power from a backup power source in response to a loss of power supplied by the power source. In the event of a loss of power, the secondary controller is configured to track the holdup time, or duration of time for which the primary controller can operate on backup power. In one embodiment, the holdup time tracked by the secondary controller is stored in a non-volatile memory in communication with the secondary controller.

20 Claims, 5 Drawing Sheets

(51) Int. Cl.
*G06F 1/26* (2006.01)
*G06F 11/20* (2006.01)

(56) References Cited

U.S. PATENT DOCUMENTS

| | | | |
|---|---|---|---|
| 5,437,040 | A | 7/1995 | Campbell et al. |
| 6,304,981 | B1 | 10/2001 | Spears et al. |
| 6,735,117 | B2 | 5/2004 | Ott |
| 7,321,174 | B2 | 1/2008 | Jones et al. |
| 7,937,602 | B2 | 5/2011 | Elliott et al. |
| 8,106,636 | B2 | 1/2012 | Asinovski et al. |
| 8,406,018 | B2 | 3/2013 | Liang |
| 8,589,110 | B2 | 11/2013 | Liu et al. |
| 8,766,707 | B1 | 7/2014 | Younger et al. |
| 8,930,647 | B1 | 1/2015 | Smith |
| 9,007,087 | B2 | 4/2015 | Avritch et al. |
| 9,141,177 | B1* | 9/2015 | Nicholls ................ G11C 5/147 |
| 2004/0124821 | A1 | 7/2004 | Elkin et al. |
| 2005/0110468 | A1 | 5/2005 | Turner et al. |
| 2011/0219243 | A1 | 9/2011 | Humphrey et al. |
| 2012/0151118 | A1* | 6/2012 | Flynn ................ G06F 11/1008 711/6 |
| 2013/0049709 | A1 | 2/2013 | Fu et al. |
| 2013/0275795 | A1* | 10/2013 | Ellis ................ G06F 1/3268 713/324 |
| 2013/0285449 | A1 | 10/2013 | Schmidt et al. |
| 2014/0059406 | A1* | 2/2014 | Hyun ................ G11C 11/5621 714/773 |
| 2014/0103955 | A1* | 4/2014 | Avritch ................ G01R 31/028 324/764.01 |
| 2014/0266293 | A1 | 9/2014 | Ye et al. |
| 2015/0171664 | A1 | 6/2015 | Liu et al. |
| 2016/0268000 | A1* | 9/2016 | Thompson ............ G11C 16/30 |
| 2016/0344834 | A1* | 11/2016 | Das ................ H04L 67/2842 |
| 2017/0020019 | A1* | 1/2017 | Tuma ................ G11C 5/04 |

OTHER PUBLICATIONS

ATX Specification version 2.01 https://web.aub.edu.lb/pub/docs/atx_201.pdf Published Feb. 1997 (Year: 1997).*
8086 16-bit HMOS Microprocessor https://www.archive.ece.cmu.edu/~ece740/f11/lib/exe/fetch.php?media=wiki:8086-datasheet.pdf Sep. 1990 (Year: 1990).*
EZ-USB NX2LP™ USB 2.0 NAND Flash Controller http://www.farnell.com/datasheets/315893.pdf Oct. 5, 2005 (Year: 2005).*

* cited by examiner

HOLDUP TIME MEASUREMENT FOR SOLID STATE DRIVES

FIELD OF THE INVENTION

This invention generally relates to measurement of holdup time during power loss protection (PLP) for solid state drives (SSDs).

BACKGROUND OF THE INVENTION

SSDs achieve much of their performance by maintaining critical data structures in volatile memory, which allows quick access during runtime. Use of volatile memory during runtime presents a problem if power is suddenly lost as volatile memory depends upon being powered to store and maintain the data in memory. Upon the loss of power to a volatile memory, the data stored in volatile memory will be lost. Accordingly, it is necessary to save critical data structures stored in volatile memory to non-volatile memory before power to the SSD falls below a threshold required for SSD operation. To address this issue, many SSDs include capacitors with high capacitance (e.g., supercapacitors, tantalum capacitors, etc.) to provide backup power for a short period of time after the loss of power. The use of a backup power source in an SSD helps prevent data loss due to a power outage or power loss. This feature is generally referred to as power loss protection (PLP).

When a power outage or power loss occurs for a host device (e.g., a computer) with an SSD, the energy stored by the supercapacitor provides backup power for a short time for the SSD to complete pending commands, save critical data and shut down properly. Without this, the SSD may not initialize properly for a subsequent boot. For example, if the volatile memory loses critical data such as the logical to physical mapping table of data (i.e., a table storing the mapping between the logical address used by the host to refer to data and the address at which data is physically located within non-volatile memory), the SSD may be unusable or may require a long data structure rebuild that requires the SSD to scan the entire drive and determine where data is located.

When an SSD with PLP is unable to save critical data to non-volatile memory, there are two possible failures that could have occurred. Either the SSD firmware failed to complete the power loss procedure while operating on backup power (e.g., procedure failed to start) or the backup power source was unable to provide power long enough for the SSD firmware to complete the power loss procedure. To identify the cause of the failure that resulted in the loss of critical data from volatile memory, it is necessary to identify how long the SSD was able to properly operate after loss of power.

One technique for measuring the duration of SSD operation on backup power measures the time from detecting a loss of power to when the SSD firmware power loss procedure completes. This technique is not achievable. If the SSD firmware logs completion of the power loss procedure, the procedure will have completed successfully and the drive will restart normally. If the SSD firmware fails to complete the power loss procedure, the duration of SSD operation on backup power will not be logged.

Another problem with using the SSD to measure the duration of SSD operation is that the SSD itself is not capable of identifying the moment at which it can longer operate as the SSD will have stopped operating at that point in time. As such, it is not possible to log an unsuccessful power loss procedure.

Accordingly, there is an unmet demand for SSDs with PLP that can efficiently and reliably measure the duration of SSD operation on backup power to identify the cause of an improper SSD shut down.

BRIEF DESCRIPTION OF THE INVENTION

In one embodiment, an SSD with PLP includes a primary controller operable at a first voltage, a secondary controller operable at a second voltage that is less than the first voltage, and a power circuit. The power circuit is configured to supply power to the primary controller and the secondary controller from a power source during normal operation of the SSD and from a backup power source in response to a loss of power supplied by the power source. The secondary controller is further configured to track a time from the loss of power supplied by the power source to a reset of the primary controller.

In one embodiment a host device comprises the power source that supplies power to the primary controller and the secondary controller during normal operation of the SSD. In another embodiment a capacitor or a battery comprises the backup power sources that supplies power to the SSD in response to a loss of power supplied by the power source during normal operation.

In one embodiment, the loss of power is detected when the power supplied by the power source during normal operation has fallen below a first predefined threshold. Further, the reset of the primary controller occurs in response to the backup power source falling below a second predefined threshold. In one embodiment, the secondary controller is configured to detect the power source falling below the first predefined threshold and the backup power source falling below the second predefined threshold.

In one embodiment, the secondary controller includes a timer to track the time from the loss of power supplied by the power source to a reset of the primary controller. In one embodiment, the secondary controller is configured to track the time by causing a bit to be stored at predefined time intervals in a non-volatile memory in communication with the secondary controller. In one embodiment, the secondary controller is configured to cause the time to be stored in the non-volatile memory at predefined time intervals.

In one embodiment, the primary controller is configured to transfer critical information from a volatile memory in communication with the primary controller to a non-volatile memory in communication with the primary controller. In on embodiment, the critical information transferred from the volatile memory to the non-volatile memory is a logical to physical address update log.

In one embodiment, a non-volatile memory is a component of the secondary controller.

In one embodiment, a method of PLP for an SSD includes supplying power from a power source during normal operation of the SSD and from a backup power source in response to a loss of power supplied by the power source. The method further includes supplying power to a primary controller operable at a first voltage, a secondary controller operable at second voltage that is less than the first voltage, and a non-volatile memory in communication with the secondary controller. The method further includes tracking a time from the loss of power to a reset of the primary controller.

In one embodiment, the method includes supplying backup power from a capacitor or a battery. In one embodiment, the method includes detecting the power source falling below a first predefined threshold. In one embodiment, the method includes detecting the backup power source falling below a second predefined threshold.

In one embodiment, the method includes storing an indication of the tracked time at predefined time intervals. In one embodiment, the method includes storing critical information in response to the loss of power in a second non-volatile memory in communication with the primary controller. In one embodiment, the method includes storing an L2P update log in response to the loss of power.

In one embodiment, the method includes storing the tracked time after regaining power from the power source.

DETAILED DESCRIPTION OF THE INVENTION

Figure 1:
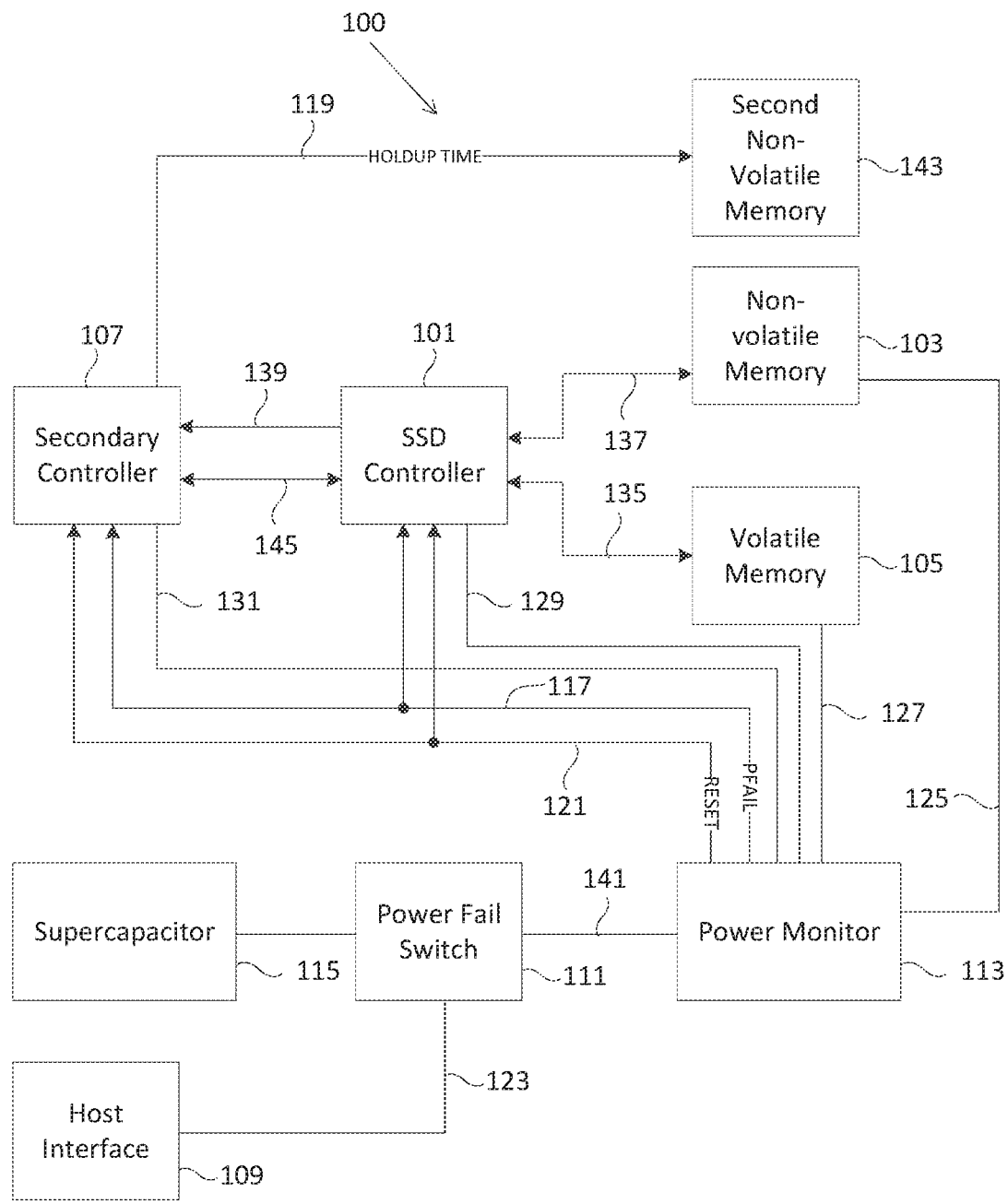
FIG. 1 is a block diagram of one embodiment of an SSD with PLP that uses a secondary controller.

FIG. 1. is a block diagram illustrating one embodiment of an SSD with PLP 100. SSD controller 101 communicates with non-volatile memory 103 through connection 137 and volatile memory 105 through connection 135. Non-volatile memory 103 can be, but is not limited to, an EEPROM, NAND, NOR, MRAM, PCM, PCME, PRAM, PCRAM, PMC, RRAM, NRAM, Ovonic Unified Memory, Chalcogenide Ram and/or C-RAM, or any other type of non-volatile memory known in the art, and volatile memory 105 can be, but is not limited to, DRAM, SRAM, T-RAM, Z-RAM and/or any other type of volatile memory known in the art. SSD controller 101 stores and retrieves data from the volatile memory 105 during normal operation to allow quick access of data during run time. SSD controller 101 may periodically store data in the non-volatile memory 103 as well.

During normal operation, a host interface 109 supplies power to the other devices of SSD with PLP 100. Host interface 109 transfers power over a connection 123 to a power fail switch 111. Power fail switch 111 may be an electromechanical switch, a switching circuit composed of transistors or MOSFETs or any other type of switch known in the art. Power fail switch 111 transfers power from the host interface 109 to a power monitor 113 over a connection 141. Power monitor 113 includes a number of voltage regulators (not shown) that regulate the power received from host interface 109 to emit regulated voltages for each of the devices of the SSD with PLP 100, including a regulated voltage 127 for volatile memory 105, a regulated voltage 125 for non-volatile memory 103, a regulated voltage 129 for SSD controller 101 and a regulated voltage 131 for a secondary controller 131. Power monitor 113 and power fail switch 111 can be implemented as part of a power circuit.

Power monitor 113 monitors the power supplied by connection 141 to determine if a loss of power occurs that may cause a loss of regulated voltages 125, 127, 129 and 131. A loss of power from the host interface 109 may occur for a number of reasons, including, for example, removal of the SSD from the system during operation, a hardware failure, loss of electrical power to the host device due to a power outage, or a large load on the host device that causes a temporary drop out in the power supplied from host interface 109. A loss of power may be detected by determining that the power supplied by connection 141 falls below a predefined threshold (e.g., 5 volts) for a predefined period of time (e.g., 5 milliseconds). Alternatively, it may be desirable to use only a predefined voltage threshold for detecting a loss of power as some applications may require detecting an instantaneous loss of power. When power monitor 113 detects a loss of power, power monitor 113 immediately emits a Supercap Enable signal to enable backup power to be supplied from a supercapacitor 115 and emits a PFAIL signal 117 identifying the loss of power to the SSD controller 101 and the secondary controller 107. Supercapacitor 115 supplies backup power to power monitor 113 through connection 141.

Upon receiving the PFAIL signal 117, the SSD controller 101 ceases normal operation and begins performing a power loss procedure to process pending commands and save critical data structures to non-volatile memory 103 before power is lost to SSD controller 101 and/or volatile memory 105. The power loss procedure may comprise various steps. SSD controller 101 may be programmed to acknowledge the completion of each step of the power loss procedure by sending a signal via a communication channel 139 to the secondary controller 107. Upon receiving PFAIL signal 117, the secondary controller immediately starts a timer The SSD with PLP 100 is capable of switching to the backup power source, supercapacitor 115, within a short period of time after detecting a loss of power from host interface 109. Depending on the components used, switching may be accomplished as quickly as a few microseconds or even nanoseconds, resulting in no perceptible change to regulated voltages 125, 127, 129 and 131. With the supply of backup power, the charge accumulated within supercapacitor 115 will decline in relation to a load presented by the components of SSD with PLP 100. Typically, the size or value selected for supercapacitor 115 powers the SSD with PLP 100 for a sufficient duration of time that allows SSD controller 101 to complete its power loss procedure. If the size or value selected for supercapacitor 115 is too small, the voltage of supercapacitor 115 may drop below the threshold for maintaining regulated voltages 125, 127 or 129. If regulated voltages 125, 127 or 129 lose regulation SSD controller 101, non-volatile memory 103 and/or volatile memory 105 may stop functioning before the SSD controller 101 can complete its power loss procedure. However, even if the size or value selected for supercapacitor 115 is correct, it is also possible that a hardware issue may cause supercapacitor 115 to malfunction.

Power monitor 113 monitors the connection 141 to determine when the voltage supplied by supercapacitor 115 drops below a predefined threshold that represents the minimum regulated voltage at which SSD controller 101 can continue to operate. When power monitor 113 detects the voltage of supercapacitor 115 falls below the threshold voltage, power monitor 113 emits RESET signal 121 to SSD controller 101, which is also monitored by secondary controller 107. RESET signal 121 causes the SSD controller 101 to cease all operations and shut down prior to regulated voltage 129 dropping below the minimum operable voltage of SSD controller 101.

When secondary controller 107 receives PFAIL signal 117, the secondary controller 107 starts a timer to track holdup time or the duration of time for which the SSD controller 101 can operate on backup power supplied by the backup power source, supercapacitor 115.

In one embodiment, the timer of secondary controller 107 can be a 200 Hz clock signal having a period of 5 ms from one rising edge to another (i.e., predefined interval or period of the clock signal). Each time 5 ms elapses (i.e., on each rising or falling edge) the secondary controller 107 tracks the holdup time by transmitting a HOLDUP TIME signal 119 to a second non-volatile memory 143 causing the second non-volatile memory 143 to store a holdup time bit (i.e., "0" or "1"). Second non-volatile memory 143 can be, but is not limited to, an EEPROM, NAND, NOR MRAM, PCM, PCME, PRAM, PCRAM, PMC, RRAM, NRAM, Ovonic Unified Memory, Chalcogenide Ram and/or C-RAM, or any other type of non-volatile memory known in the art. If the SSD controller 101 sent an acknowledgement to the secondary controller 107 indicating the completion of a particular step of the power loss procedure, the secondary controller 107 can also cause the acknowledgement to be stored in the second non-volatile memory 143 When the secondary controller 107 receives RESET signal 121, the timer stops and the total number of holdup time bits stored in the second non-volatile memory 143 represents the holdup time of SSD controller 101 during backup power. For example, if the timer of secondary controller 107 is a 200 Hz clock signal and 20 holdup time bits are stored in non-volatile memory, the holdup time bits indicate that the SSD controller 101 operated for a holdup time of 100 milliseconds.

In another embodiment, when the secondary controller 107 receives PFAIL signal 117, the secondary controller 107 erases a portion of the second non-volatile memory 143 by setting all bits in the portion of memory to a single value (e.g., "1" or "0"). The secondary controller 107 also starts a timer to track holdup time or the duration of time for which the SSD controller 101 can operate on backup power supplied by the backup power source, supercapacitor 115.

For example, in one embodiment, the secondary controller 107 can erase a 32-byte page in secondary non-volatile memory 143 (e.g., an EEPROM) by setting all bits to a value of "1." Accordingly, each byte of the 32-byte page will have 8 bit set to a value of "1." The timer of secondary controller 107 can be a 200 Hz clock signal having a period of 5 ms from one rising edge to another (i.e., predefined interval or period of the clock signal). Each time 5 ms elapses (i.e., on each rising or falling edge) the secondary controller 107 transmits a HOLDUP TIME signal 119 to the second non-volatile memory 143 causing the second non-volatile memory 143 to transition a bit in the 32-byte page from a "1" to a "0." After 40 ms, the secondary controller 107 will have transitioned all 8 bits in the first byte of the 32-byte page from a "1" to a "0," causing the secondary controller 107 to start transitioning bits in the next byte of the 32-bye page in second non-volatile memory 143 during subsequent cycles of the 5 ms timer. If the SSD controller 101 sent an acknowledgement to the secondary controller 107 indicating the completion of a particular step of the power loss procedure, the secondary controller 107 can also cause the acknowledgement to be stored in the second non-volatile memory 143. When the secondary controller 107 receives RESET signal 121, the timer stops and the total number of "0" bits stored in the 32-byte page of the second non-volatile memory 143 represents the holdup time of SSD controller 101 during backup power. For example, if the timer of secondary controller 107 is a 200 Hz clock signal and 83 "0" bits are stored in the 32-byte page (i.e., 10-bytes storing 8 "0" bits and an 11th-byte storing 3 "0" bits) of the second non-volatile memory 143, the holdup time bits indicate that the SSD controller 101 operated for a holdup time of 415 milliseconds. Second non-volatile memory 143 can be, but is not limited to, EEPROM, NAND, NOR, MRAM, PCM, PCME, PRAM, PCRAM, PMC, RRAM, NRAM, Ovonic Unified Memory, Chalcogenide Ram and/or C-RAM, or any other type of non-volatile memory known in the art.

In another embodiment, when secondary controller 107 receives PFAIL signal 117, a timer starts to track the duration of time for which the SSD controller 101 can operate on backup power. Secondary controller 107 periodically transmits HOLDUP TIME signal 119 to store the current holdup time in the second non-volatile memory 143. A separate signal operates within the secondary controller 107 and initiates the transmission and storage of the holdup time each time a predefined interval elapses. For example, if a 200 Hz clock signal is used, every 5 ms (i.e., predefined interval or period of the clock signal) the secondary controller 107 transmits HOLDUP TIME signal 119 to store the measured holdup time in second non-volatile memory 143. After 5 ms, the value stored in non-volatile memory is 5 ms, after 10 ms, the value stored in non-volatile memory is 10 ms, etc. The benefit to this approach is that the latest measurement of holdup time is always stored in the second non-volatile memory 143 and does not need to be calculated as in the case of tracking the holdup time by storing bits (described above). However, this approach requires more free memory than storing bits as the measured holdup time is stored at predefined intervals.

If the SSD controller 101 is unable to complete the power loss procedure during backup power, the holdup time stored in non-volatile memory 103 indicates the duration of time for which SSD controller 101 operated on backup power and the acknowledgement stored in the second non-volatile memory 143 identifies the last step of the power loss procedure completed by SSD controller 101. When the SSD with PLP 100 regains power, the SSD controller 101 sends a signal over communication channel 145 to the secondary controller 107 requesting that the secondary controller 107 return the holdup time and/or acknowledgements. If the holdup time was tracked by storing holdup time bits in the second non-volatile memory 143, the secondary controller 107 calculates the holdup time and transmits the calculated holdup time to the SSD controller 101 over communication channel 145 along with any acknowledgements. If the holdup time was tracked by storing the holdup time at predefined intervals, the secondary controller 107 retrieves the last holdup time and returns the holdup time to the SSD controller 101 over communication channel 145 along with any acknowledgements. When the SSD controller 101 receives the holdup time and/or acknowledgments from the secondary controller 107, the SSD controller 101 stores the information in an operational log.

Preferably, secondary controller 107 and second non-volatile memory 143 operate at voltages that are lower than the minimum operable voltage of the SSD controller 101. Accordingly, secondary controller 107 and second non-volatile memory 143 will continue to operate on the backup power provided by supercapacitor 115 for a period of time after SSD controller 101 received the RESET signal 121.

The embodiment of FIG. 1 does not require that the power monitor 113 detects the loss of power and emits PFAIL signal 117 and RESET signal 121. This functionality can be incorporated in the secondary controller 107. Secondary controller 107 can monitor power from the host interface 109 and when the secondary controller 107 detects a loss of power, the secondary controller 107 can emit the PFAIL signal 117 to the SSD controller 101 and the Supercap Enable signal to the power fail switch 111. When the backup power voltage drops below a predefined threshold, the secondary controller 107 can emit the RESET signal 121 to shut down the SSD controller 101 before the regulated voltage 129 drops below a threshold representing the minimum operable voltage of the SSD controller 101. Alternatively, the SSD controller 101 could monitor power from the host interface 109 and when a loss of power is detected, the SSD controller 101 could immediately begin performing its power loss procedure. The SSD controller 101 could further notify the secondary controller 107 of the detected power loss by emitting PFAIL signal 117 and could cause the power fail switch 111 to switch to supercapacitor 115 by emitting the Supercap Enable signal.

Although the embodiment of FIG. 1 describes the backup power source as a supercapacitor, any type of power source can be used, including tantalum capacitors or a battery.

In another embodiment, second non-volatile memory 143 can be an internal component of secondary controller 107. In this embodiment, HOLDUP TIME signal 119 would be an internal signal of secondary controller 107 to communicate with the second non-volatile memory 143. In another embodiment, non-volatile memory 103 can be used by the secondary controller 107 to store the tracked holdup time and/or acknowledgements, eliminating the need for second non-volatile memory 143. If only a single non-volatile memory is used, secondary controller 107 writes the tracked holdup time and/or acknowledgements directly to non-volatile memory 103 via HOLDUP TIME signal 119. In this embodiment, it may be preferable to have a dedicated partition in non-volatile memory 103 for secondary controller 107 to write the tracked holdup time and/or acknowledgements. Further, in this embodiment, non-volatile memory 103 preferably operates at voltage that is lower than the minimum operable voltage of the SSD controller 101 so that the non-volatile memory 103 continues to operate on backup power for a period of time after SSD controller 101 received RESET signal 121. If non-volatile memory 103 is a NAND flash memory, it may be desirable to have a second non-volatile memory 143 that is an EEPROM, NOR flash memory or equivalent to write the tracked holdup time and/or acknowledgements. Repeatedly performing erase and write operations to a page of NAND flash memory is inefficient and can result in damaging the page in memory.

Figure 2:
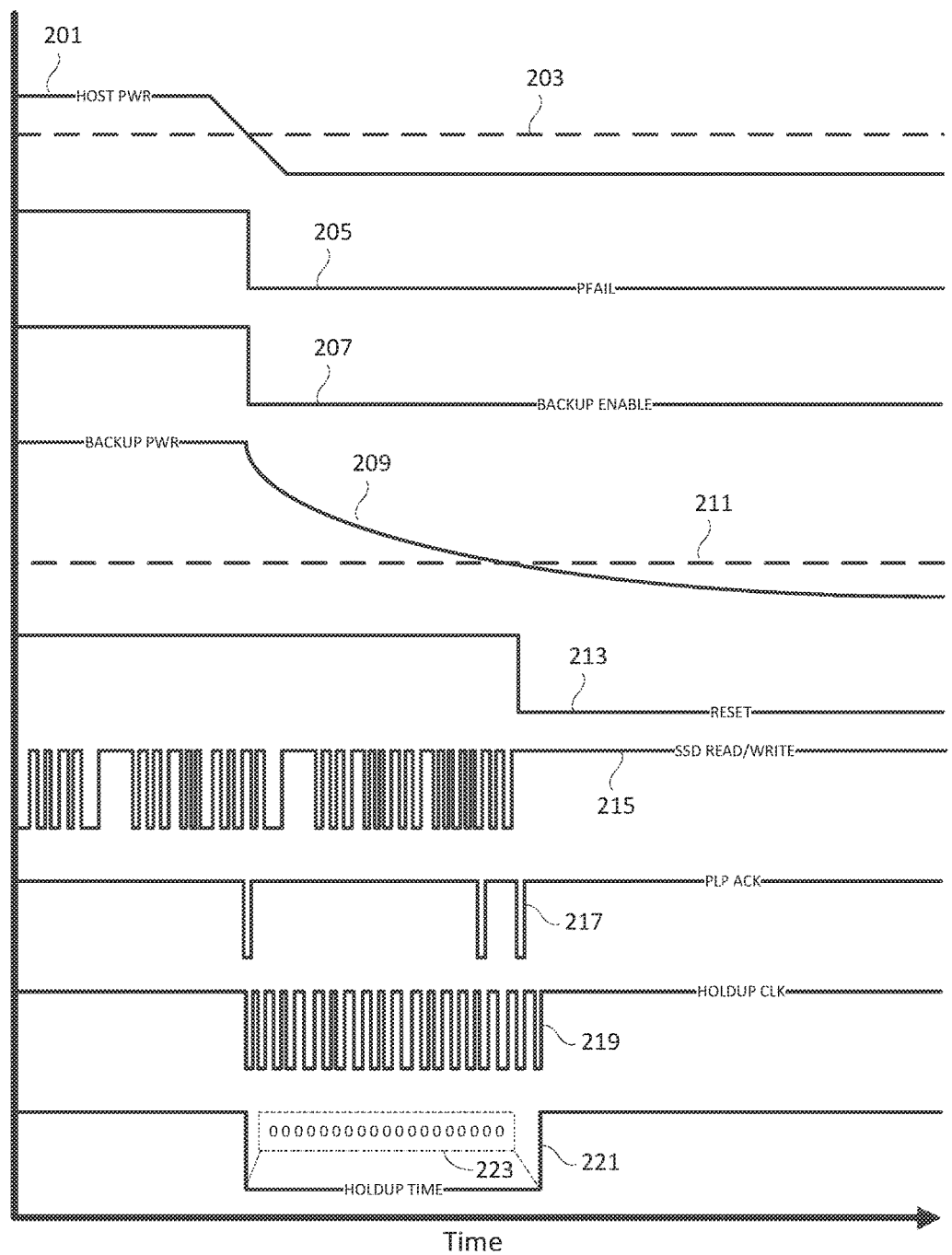
FIG. 2 is a timing diagram of one embodiment of an SSD with PLP illustrating the measurement of holdup time.

FIG. 2. is a timing diagram of one embodiment of an SSD with PLP, as described above, having a backup power source 115, a power circuit (comprised of a power fail switch 111 and a power monitor 113), a primary controller 101 and a secondary controller 107. During normal operation a host interface 109 provides power to the SSD with PLP. A HOST PWR signal 201 monitors the power provided by the host interface 109 and a BACKUP PWR signal 209 monitors the charge accumulated within the backup power source 115. During normal operation the host interface 109 (or any other power source available during normal operation) supplies power to the supercapacitor 115. During normal operation there is no load on the backup power source 115, which allows the accumulated charge on the backup power source 115 to remain substantially constant (represented by the constant portion of BACKUP PWR signal 209). During normal operation, the primary controller 101 performs read and write operations to a volatile memory 105 (represented by rising and falling edges of SSD READ/WRITE signal 215).

The power circuit causes a BACKUP ENABLE signal 207 to transition from high to low if the power circuit detects that the power provided by the host interface 109 falls below a predefined threshold 203 (represented by falling edge of signal 201 crossing threshold 203). When BACKUP ENABLE signal 207 transitions from high to low, the backup power source 115 (e.g., supercapacitor, battery, or other backup powers source) is enabled. When power from the host interface 109 falls below a predefined threshold 203, SSD with PLP also causes a PFAIL signal 205 to transition from high to low. In response to signal 207 transitioning from high to low, the backup power source 115 begins to power the SSD with PLP and the charge accumulated in the backup power source 115 begins to decline in proportion to the load presented by the SSD with PLP (represented by the declining portion of signal 209).

Further, in response to PFAIL signal 205 transitioning from high to low, the primary controller 101 begins a power loss procedure to complete pending commands and save critical data structures from volatile memory 105 to non-volatile memory 103. When PFAIL signal 205 transitions from high to low, SSD with PLP does not accept further read or write commands from the host interface 109. Additionally, in response to PFAIL signal 205 transitioning from high to low, the secondary controller 107 starts a timer, represented by a HOLDUP CLK signal 219, to measure the duration of time for which the primary controller 101 can operate on backup power supplied by the backup power source 115.

When HOLDUP CLK signal 219 begins oscillating, the primary controller 101 may send an acknowledgement bit to the secondary controller 107 through a signal 145, which the secondary controller 107 then writes to a second non-volatile memory 143 confirming that the secondary controller 107 started tracking the holdup time (represented by the first high to low to high transition of PLP ACK signal 217). Each time the primary controller 101 completes a step of the power loss procedure another acknowledgement may be sent to the secondary controller 107 and stored in second non-volatile memory 143. For example, the secondary controller 107 may store an acknowledgement bit in the second non-volatile memory 143 (represented by the second high to low to high transition of PLP ACK signal 217) when the SSD controller 101 stores critical data structures from volatile memory 105 to non-volatile memory 103. The primary controller 101 sends another acknowledgement bit to the secondary controller 107 to be stored in second non-volatile memory 143 (represented by the third high to low to high transition of PLP ACK signal 217) when the SSD controller 101 completes pending read/write commands (represented by the constant portion of SSD READ/WRITE signal 215).

Each time HOLDUP CLK signal 219 transitions from high to low, the secondary controller 107 tracks the holdup time by storing a holdup time bit 223 in second non-volatile memory 143 (i.e., a "0" bit is stored).

When the backup power voltage falls below a predefined threshold 211 (represented by BACKUP PWR signal 209 crossing threshold 211) the SSD with PLP causes a RESET signal 213 to transition from high to low. Predefined threshold 211 represents the minimum regulated voltage at which the primary controller 101 can operate. Upon the transition of the RESET signal 213 from high to low the primary controller 101 ceases all functions and powers down and the HOLDUP CLK signal 219 of the secondary controller 107 stops oscillating. Once HOLDUP CLK signal 219 stops oscillating, further holdup time bits 223 will not be stored by the secondary controller 107 to second non-volatile memory 143. Thus, HOLDUP CLK signal 219 starts oscillating when HOST PWR signal 201 crosses threshold 203 and stops oscillating when BACKUP PWR signal 209 crosses threshold 211, effectively tracking the duration of time that the primary controller 101 operated on backup power. If the HOLDUP CLK signal 219 transitions from high to low twenty times, twenty holdup time bits 223 (represented by "0"s) are stored by the secondary controller 107 in second non-volatile memory 143. If HOLDUP CLK signal 219 is a 200 Hz signal having a period of 5 ms (i.e., predefined interval or period of the clock signal), the holdup time measured by HOLDUP TIME signal 221 is 100 ms.

If the primary controller 101 is unable to complete the power loss procedure during backup power, HOLDUP TIME signal 221 tracks the duration of time for which the primary controller 101 operated on backup power and PLP ACK signal 217 identifies the last step of the power loss procedure completed by the primary controller 101.

Although the timing diagram of FIG. 2 describes various steps occurring as a result of the signals transitioning from high to low (i.e., as a result of a falling edge of a signal), in an alternative implementation the various steps may occur as a result of the signals transitioning from low to high (i.e., as a result of a rising edge of a signal), or a combination of signals transitioning from low to high and high to low.

In another embodiment, second non-volatile memory 143 can be an internal component of secondary controller 107. In another embodiment, non-volatile memory 103 can be used by the secondary controller 107 to store the tracked holdup time and/or acknowledgements, eliminating the need for second non-volatile memory 143.

Figure 3:
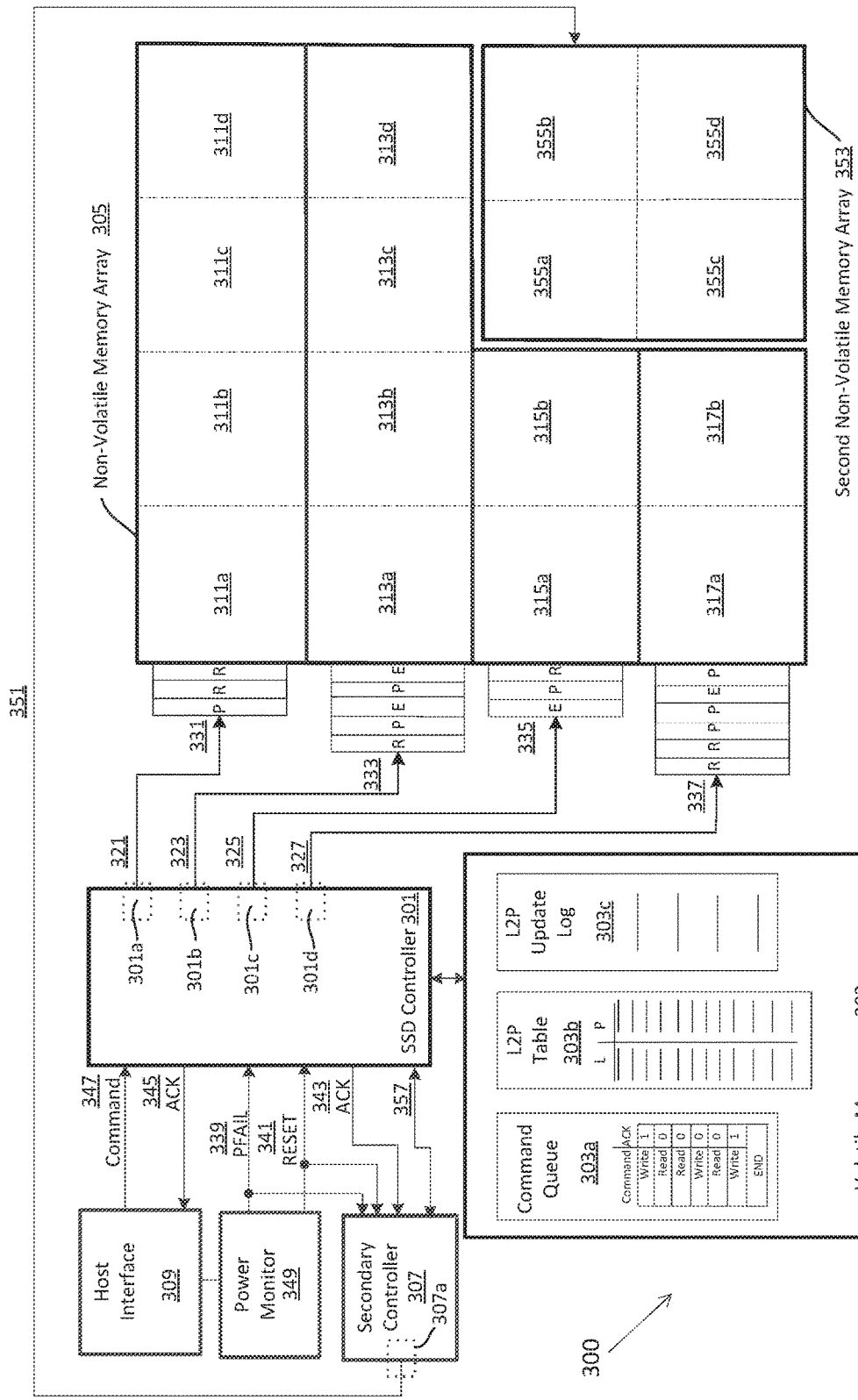
FIG. 3 is a block diagram of one embodiment of an SSD with PLP.

FIG. 3 is a block diagram of one embodiment of an SSD with PLP 300 during normal operation. A volatile memory 303 is used for the temporary storage of commands and data that is being processed by an SSD Controller 301. The SSD controller 301 stores in volatile memory 303 a command queue 303*a* containing incoming commands from a host interface 309, a logical to physical address translation table, or L2P table 303*b*, and a log of updates to be applied to the L2P table, or L2P update log 303*c*. The volatile memory 303 can comprise DRAM, SRAM, T-RAM, Z-RAM and/or any other type of volatile memory known in the art.

SSD controller 301 also communicates with a non-volatile memory 305, which is typically an array organized in banks of non-volatile memory devices 311*a-d*, 313*a-d*, 315*a-d*, and 317*a-d*, which provide permanent or long-term storage for the data. The non-volatile memory devices 311*a-d*, 313*a-d*, 315*a-b*, and 317*a-b* can comprise, NAND flash memory, NOR flash memory, an EEPROM or any other non-volatile memory known in the art in any combination.

The SSD controller 301 temporarily buffers commands 347 received from the host interface 309 in a command queue 303*a* in the volatile memory 303. When the SSD controller 301 executes a command 347 received from the host interface 309, the SSD controller 301 returns an acknowledgement, ACK signal 345, to the host interface 309. If the command 347 is a read command, the SSD controller 301 does not issue an acknowledgement, ACK signal 345, until the read command is performed and the data is returned to the host interface 309. If the command 347 is a write command, the SSD controller 301 may issue the ACK 345 signal as soon as the command is stored in the command queue 303*a*, on the assumption that the command will be processed and the data will be stored in non-volatile memory 305. When the SSD controller 301 sends an acknowledgement to the host interface 309 for a write command that has not yet been executed, the SSD controller 301 updates the command queue 303*a* in the volatile memory 303 to indicate that an acknowledgement was sent (represented by assigning an ACK value of "1" in command queue 303*a*). If a write command is acknowledged before it is written to the non-volatile memory 305, the data for the write command is critical information if there is a loss of power, as the host interface 309 thinks the write command was executed by the SSD controller 301. If the write command is not executed by the SSD controller 301 before a loss of power, when the host interface 309 requests that data upon a subsequent power-up, out of date or incorrect data may be returned by the SSD controller 301.

The SSD controller 301 processes the commands in the command queue 303*a* and the data is read from and written to the non-volatile memory 305 using multiple memory data channels 321, 323, 325 and 327. In other embodiments, the non-volatile memory 305 may comprise any number of channels (i.e., 1 or more). Each channel is controlled independently by a channel controller 301*a*, 301*b*, 301*c* and 301*d* within the SSD controller 301, and each channel controller communicates with a corresponding subset of the non-volatile memory devices 311*a-d*, 313*a-d*, 315*a-d*, and 317*a-d*. Within each channel controller 301*a-d*, there is a channel command queue 331, 333, 335 and 337. Within each channel command queue 331, 333, 335 and 337, there may be a different mixture of memory commands directed to the corresponding non-volatile memory devices, including read (represented by "R"), write/program (represented by "P") and erase (represented by "E").

Similarly, secondary controller 307 includes a channel controller 307*a* that allows the secondary controller 307 to write to non-volatile memory devices 355*a-d* of second non-volatile memory 353 through a communication channel 351. The non-volatile memory devices 355*a-d* can comprise, NAND flash memory, NOR flash memory, an EEPROM or any other non-volatile memory known in the art in any combination.

The L2P table 303*b* is a table that identifies the logical location of a data block that is understood by the host interface 309 (i.e., the logic block address provided by commands 347 from the host interface 309) and the location where the data is physically stored in the non-volatile memory 305 (i.e., expressed by non-volatile memory device, block number, page number and offset within the page). The SSD controller 301 periodically stores copies of the L2P table 303*b* in the non-volatile memory 305 to ensure the data is available if the SSD controller 301 and/or volatile memory 303 unexpectedly lose power and power down. However, the SSD controller 301 primarily uses and updates the L2P table 303*b* stored in volatile memory 303 for fast and convenient access. Upon power-up, the SSD controller 301 copies the L2P table 303*a* from non-volatile memory 305 to volatile memory 303.

The L2P Table 303*b* must be continuously updated as new or updated data is written to the non-volatile memory 305. In order to maintain good write performance, the SSD controller 301 does not update the copy of the L2P table 303*a* stored in non-volatile memory 305 every time new data is written to non-volatile memory 305 as this requires additional processing that causes the SSD with PLP 300 to operate slowly and inefficiently. Instead, the SSD controller 301 maintains the newly written data in an L2P update log 303*c* that identifies newly written data since the last update of the L2P table 303*a* stored in non-volatile memory 305. In normal operation when the L2P update log 303*c* reaches a threshold requirement, which may be based on the amount of memory available to store the L2P update log 303c (e.g., the number of entries in the L2P update log 303c and/or duration of time since the last L2P update log 303c was saved), the SSD controller 301 may update any copies of L2P table 303b in non-volatile memory 305 (not shown). In an alternative embodiment, L2P update log 303c is used to update any copies of the L2P table 303b in non-volatile memory 305 (not shown) at predefined intervals. Performing these updates at predefined intervals ensures that a large sequence of L2P write activity does not cause the L2P update log 303c to exceed the amount of memory available to store the L2P update log 303c in volatile memory 303. The periodic updating of the L2P tables (in volatile and non-volatile memory) means that at the instant when a power failure occurs, the L2P tables in non-volatile memory 305 may be missing the latest updates from the L2P update log 303c. Accordingly, the L2P update log 303c is also considered critical information that should be written to the non-volatile memory 305 if there is a loss of power.

Figure 4:
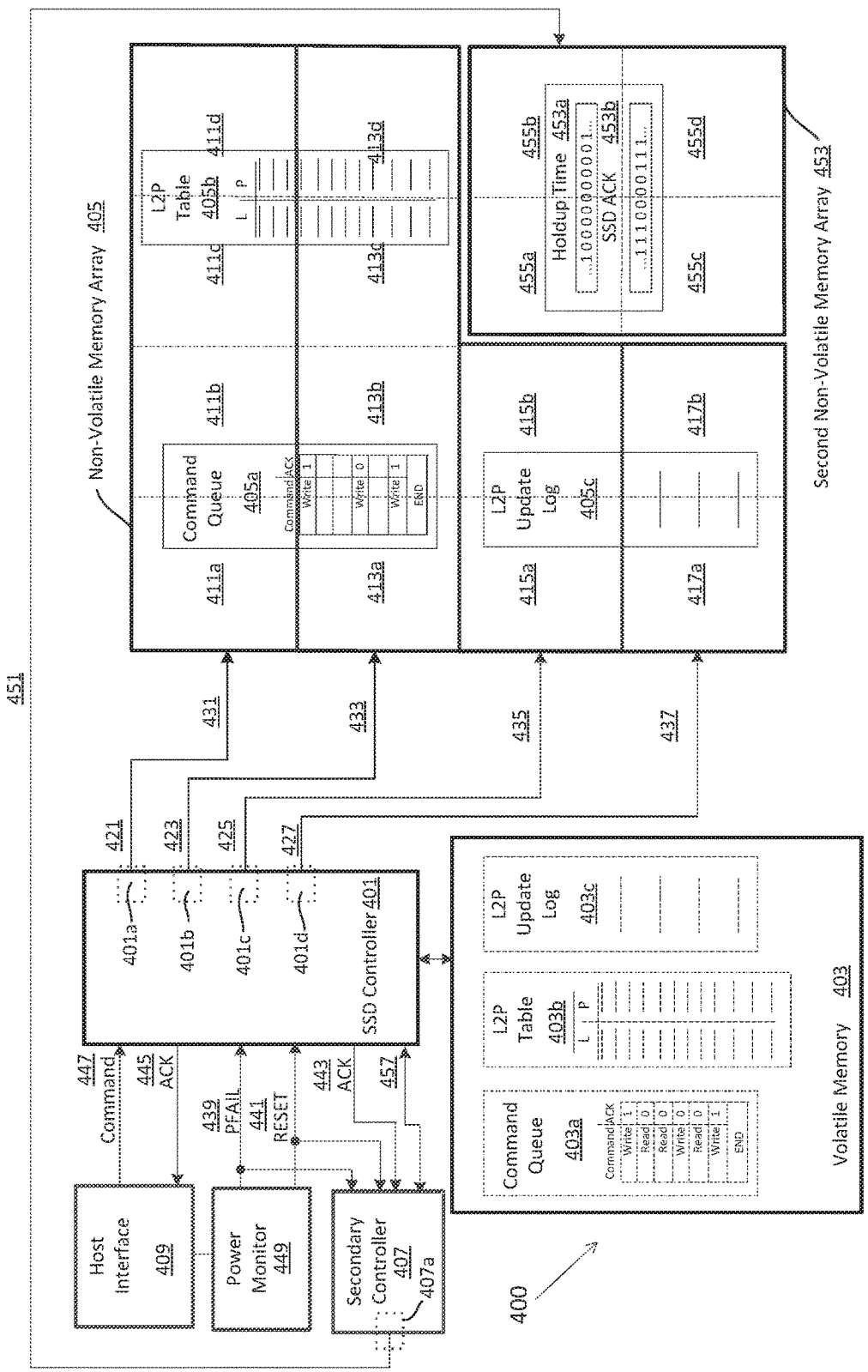
FIG. 4 is a block diagram of one embodiment of an SSD with PLP.

FIG. 4 is a block diagram of another embodiment of an SSD with PLP 400 during a loss of power. A power monitor 449 is configured to detect a loss of power provided to the SSD with PLP 400 from a host interface 409. A loss of power from host interface 409 may occur for a number of reasons, including, for example, removal of the SSD from the system during operation, a hardware failure, loss of electrical power to the host device due to a power outage, or a large load on the host device that causes a temporary drop out in the power supplied by the host device. Power monitor 449 may detect a loss of power by detecting that the power supplied by host interface 409 falls below a predefined threshold (e.g., 5 volts) for a predefined period of time (e.g., 5 milliseconds). Alternatively, it may be desirable to use only a predefined voltage threshold for detecting a loss of power as some applications may require detecting an instantaneous loss of power. When power monitor 449 detects a loss of power, it immediately emits a PFAIL signal 439 identifying the loss of power to the SSD controller 401 and the secondary controller 407. Power monitor 449 also enables a backup power source (not shown), which provides backup power to SSD with PLP 400. Alternatively, either SSD controller 401 or secondary controller 407 may enable the backup power source (not shown) in response to receiving PFAIL signal 407.

Power monitor 449 also monitors the backup power source. When power monitor 449 detects the voltage of the backup power source fall below a threshold voltage (i.e., the minimum voltage at which SSD controller 401 can continue to operate) power monitor 449 emits a RESET signal 441 to SSD controller 401, which is also monitored by secondary controller 407. RESET signal 441 causes the SSD controller 401 to cease all operations and shut down prior to SSD controller 101 losing power. Preferably, secondary controller 407 and second non-volatile memory 453 operate at voltages that are lower than the minimum operable voltage of the SSD controller 401. Accordingly, secondary controller 407 and second non-volatile memory 453 will continue to operate on backup power for a period of time after SSD controller 401 received the RESET signal 421.

Upon receiving the PFAIL signal 439, the SSD controller 401 ceases normal operation and begins performing a power loss procedure to process pending commands and save critical data structures to non-volatile memory 405 before backup power is lost to SSD controller 401 and/or volatile memory 403. Pending commands in channel command queues 431, 433, 435 and 437 (e.g., read, write/program, and erase commands, not shown) are not changed or stopped by the SSD controller 401. Since the backup power source continues to power non-volatile memory 405, the pending commands in channel command queues 431, 433, 435 and 437 are executed. In another embodiment, all read commands in channel command queues 431, 433, 435 and 437 are disregarded because the data is simply not read and no data or acknowledgement, ACK signal 445, is returned to the host interface 409. In this case, the host interface 409 may later (after having regained power) process the error and take remedial action (e.g., by retrying the command or returning a read error to the application that caused the command to be issued). In another embodiment, all pending commands in channel command queues 431, 433, 435 and 437 may be stopped by the SSD controller 401 to reduce the consumption of backup power and ensure that critical data structure can be saved to non-volatile memory 405 before backup power is lost to SSD controller 401 or volatile memory 403. After processing and/or stopping pending commands in channel command queues 431, 433, 435 and 437, the SSD controller 401 begins saving critical data from volatile memory 403 to non-volatile memory 405. There may be write commands in command queue 403a that were acknowledged by SSD controller 401 but were not actually written to non-volatile memory 405. If the write commands are lost due to a power failure, when the host later tries to retrieve the associated data, either the data returned will be old data or the data will be absent and an error will be returned. Accordingly, SSD controller 401 saves a copy of the command queue 403a to non-volatile memory 405 containing at least the acknowledged write commands that have not been processed in command queue 405a.

In one embodiment, the read commands and unacknowledged write commands in command queue 403a are omitted from the command queue 405a stored to non-volatile memory 405. The host can determine that it needs to reissue unexecuted read commands if the host interface 409 did not receive data in response to the read command from the SSD controller 101 prior to the loss of power. Similarly, the host can determine that it needs to reissue write commands if the host interface 409 did not receive an acknowledgement from the SSD controller 401 that the SSD controller 401 would write the data to non-volatile memory 405 prior to the loss of power. However, it may be desirable to save all commands from command queue 403a to the command queue 405a, including unacknowledged write commands (and the associated data to be written) and read commands. The SSD controller additionally must save the L2P update log 403c to non-volatile memory 405 as L2P update log 405c. It is important to save the L2P update log 403c to non-volatile memory 405 because the L2P table 403b stored in volatile memory 403 and the L2P table 405b stored in non-volatile memory may not be up-to-date. The SSD controller 401 may send an acknowledgment to secondary controller 407, via ACK signal 443, each time the SSD controller 401 completes a step of the power loss procedure.

Upon receiving PFAIL signal 439, the secondary controller 407 starts a timer to track the duration of time for which the SSD controller 401 can operate on backup power supplied by the backup power source. The timer of secondary controller 407 can be a clock signal having a predefined frequency. Upon each rising or falling edge of the clock signal (i.e., predefined interval or period of the clock signal), a channel controller 407a of secondary controller 407 transmits a write command over memory data channel 451 causing the second non-volatile memory 453 to store a holdup time bit 453a (represented by a "0" bit). If the SSD controller 401 sends an acknowledgement to the secondary controller 407 indicating that a particular step of the power loss procedure is complete, via ACK signal 443, the secondary controller 407 can transmit a write command over memory data channel 451 causing the second non-volatile memory 453 to store an SSD ACK bit 453*b* (represented by a "0" bit). When the secondary controller 407 monitor identifies RESET signal 441, the secondary controller 407 stops the timer and the total number of holdup time bits 453*a* stored in second non-volatile memory 453 represent the holdup time of SSD controller 401 during backup power. For example, if the timer of secondary controller 407 is a 1 kHz clock signal and 10 holdup time bits 453*a* (represented by ten "0s") are stored in second non-volatile memory 453, the holdup time bits 453*a* indicate that the SSD controller 401 operated for a holdup time of 10 milliseconds. It may be desirable to use a higher frequency clock signal to measure the holdup time, as a higher frequency clock signal will result in better resolution for tracking holdup time. Further, the total number of SSD ACK bits 453*b* stored in second non-volatile memory 453 represents the number of steps from the power loss procedure completed by SSD controller 401.

In another embodiment, the secondary controller 407 periodically transmits the current holdup time upon each rising or filing edge of a clock signal. For example, if a 1 kHz clock signal is used, every 1 ms (i.e., predefined interval or period of the clock signal) the secondary controller 407 transmits the measured holdup time to second non-volatile memory 453. After 5 ms, the value stored in second non-volatile memory 453 is 5 ms, after 7 ms, the value stored in second non-volatile memory 453 is 7 ms, etc.

After the SSD controller 401 completes the power loss procedure in response to the loss of power, the data previously stored in volatile memory 403 is lost (e.g., command queue 403*a*, L2P table 403*b* and L2P update log 403*c*) and the non-volatile memory 405 contains all of the necessary critical information to restart the SSD with PLP 400.

If the SSD controller 401 is unable to complete the power loss procedure during backup power, holdup time 453*ad* indicates the duration of time for which the SSD controller 401 operated on backup power and SSD ACK 453*b* identifies the last step of the power loss procedure completed by the SSD controller 401.

When the SSD with PLP 400 regains power, the SSD controller 401 sends requests over communication channel 457 to the secondary controller 407 requesting that the secondary controller 407 return the holdup time and/or acknowledgements. The channel controller 407*a* of secondary controller 407 retrieves the holdup time 453*a* and acknowledgements, SSD ACK 453*b*, by sending read signals over memory data channel 451 to non-volatile memory devices 455*a*-*d*. If the holdup time was tracked by storing holdup time bits 453*a* in the second non-volatile memory 453, the secondary controller 407 calculates the holdup time and transmits the calculated holdup time to the SSD controller 401 over communication channel 457. If the holdup time was tracked by storing the measured holdup time at predefined intervals, the secondary controller 407 retrieves the last measurement of holdup time and returns the holdup time to the SSD controller 401 over communication channel 457. Similarly, the secondary controller 407 returns the acknowledgements, SSD ACK 453*b*, to the SSD controller 401 over communication channel 457. When the SSD controller 401 receives the holdup time and/or acknowledgments from the secondary controller 407, the SSD controller 401 stores the data in an operational log.

In another embodiment, second non-volatile memory 453 can be an internal component of secondary controller 407. In another embodiment, non-volatile memory 405 can be used by the secondary controller 407 to store the tracked holdup time 453*a* and/or acknowledgements 453*b*, eliminating the need for second non-volatile memory 453.

Figure 5:
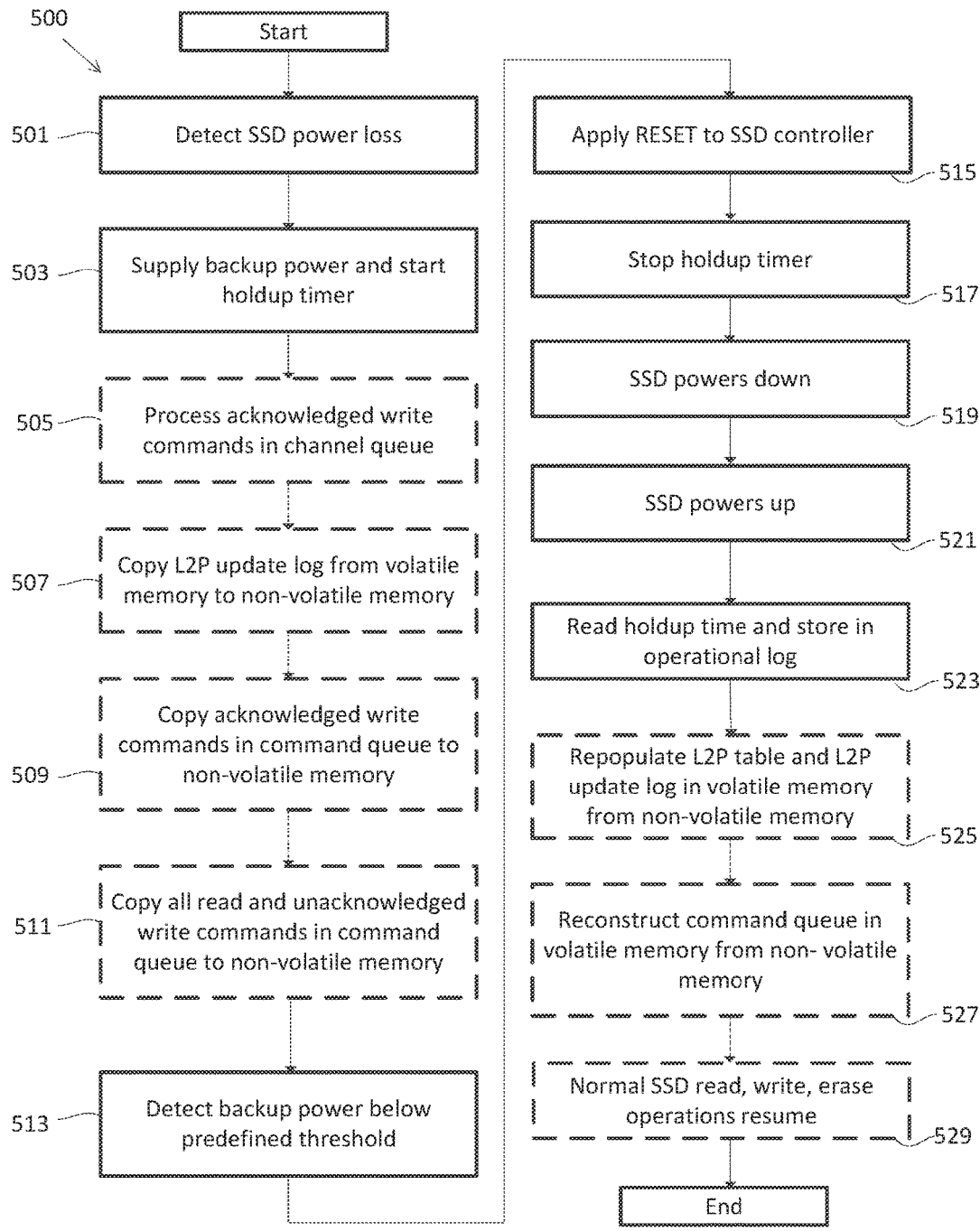
FIG. 5 is a flowchart of steps for one embodiment of measuring the holdup time of an SSD with PLP.

FIG. 5 is a flowchart of steps 500 for one embodiment of performing PLP for an SSD, as described above. The SSD with PLP, comprising an SSD controller 101, a secondary controller 107, a volatile memory 105, a non-volatile memory 103, a second non-volatile memory 143 and a power circuit (comprised of power fail switch 111 and power monitor 113) connected to a host device, such as a computer, via a host interface 109, as described above. At step 501, the power circuit detects a drop in the power supplied from the host interface 109, indicating that the host device has experienced a loss of power. In one embodiment, the power circuit sends an alert signal to the SSD controller 101 and the secondary controller 107 indicating the loss of power. At step 503, the power circuit switches to a backup power supply 115 to provide power to the SSD controller 101, the secondary controller 107, the volatile memory 105, and the non-volatile memory 103. The backup power supply 115 may comprise a supercapacitor, a battery, or any other suitable device for providing backup power to the components of the SSD, or any combination thereof. Additionally, at step 503, the secondary controller 107 starts a timer to track the duration of time for which the SSD controller 101 can operate on backup power.

At step 505, the SSD controller 101 processes all of the acknowledged write commands in the channel command queues. As previously discussed, acknowledged write commands are critical information in the event of a power failure because, upon reboot, the hose device will expect that certain data has been written to the non-volatile memory 103. Optionally, in one embodiment, at step 505, the SSD controller 101 may also processes all unacknowledged write commands and read commands in the channel command queues as would be done in normal operation. Processing all unacknowledged write commands and read commands in the channel command queues is not necessary because the host device can simply reissue any failed read and/or write commands when power is restored to the SSD, as the host will not expect that an unacknowledged read or write command was processed.

At step 507, the L2P update log is copied from the volatile memory 105 to non-volatile memory 103. At step 509, all acknowledged write commands in the host command queue are copied to non-volatile memory 103. Optionally, in one embodiment, at step 511 all read and unacknowledged write commands in the host command queue are also copied to non-volatile memory 103. However, as previously discussed, read and unacknowledged write commands are not critical information that must be saved to non-volatile memory 103 and can be addressed by the host device after regaining power with no detrimental effect. Accordingly, in one embodiment, step 511 is skipped to reduce the amount of information copied to the non-volatile memory 103 and the method steps 500 proceeds directly from step 509 to step 511.

After the SSD controller 101 completes each of steps 505, 507, 509 and 511, the SSD controller 101 may be programmed to send an acknowledgement signal to the secondary controller 107 indicating that a particular step of the power loss procedure completed. If the secondary controller 107 receives an acknowledgement from the SSD controller 101, the secondary controller 107 may store the acknowledgement in second non-volatile memory 143 after the completion of the respective step.

At step 513, the power circuit detects that the power supplied by the backup power source 115 has fallen below a predefined threshold that represents the minimum voltage at which the SSD controller 101 can continue to operate. At step 515, the power circuit applies a RESET signal to the SSD controller 101. The secondary controller 107 and second non-volatile memory 143 preferably operate at a lower voltage than the SSD controller 101, and thus, continue to operate on backup power for a longer period of time than the SSD controller 101. In response to applying RESET to the SSD controller 101 (step 515), at step 517 the secondary controller 107 stops the timer for tracking holdup time. During the time that SSD controller 101 is operating on backup power (i.e., steps 503 through 515), the secondary controller 107 periodically stores an indication of the tracked holdup time in second non-volatile memory 143. At step 519, the SSD powers down. At step 521, after the host device regains power the SSD device powers back up. At step 523, the SSD controller 101 sends a request to secondary controller 107 to return the holdup time and acknowledgements. In response to the request from SSD controller 101, secondary controller 107 retrieves the holdup time and acknowledgements stored in second non-volatile memory 143 and returns the data to SSD controller 101. If the holdup time is tracked by storing holdup time bits in second non-volatile memory 143, secondary controller 107 calculates the holdup time and returns the calculated holdup time to SSD controller 101. SSD controller 101 stores the holdup time and acknowledgements received from secondary controller 107 in an operational log. In an alternative embodiment, only a single non-volatile memory may be used (e.g., non-volatile memory 103). In this embodiment, at step 523, the secondary controller 107 retrieves the holdup time and acknowledgements stored in volatile memory 103 and returns the data to SSD controller 101. At step 525, the SSD controller 101 repopulates the L2P table and L2P update log from non-volatile memory 103 to the volatile memory 105. At step 527, the SSD controller 101 reconstructs the host command queue from non-volatile memory 103 to the volatile memory 105. At step 529, the SSD controller 101 can resume normal read, write, and erase operations.

If the SSD controller 101 is unable to complete any of steps 505, 507, 509 or 511 (represented by dashed lines), steps 513 through 523 (represented by solid lines) would still execute as these steps occur when the power circuit detects the backup power source 115 is below a predefined threshold. The holdup time in step 517 indicates the duration of time for which the SSD controller 101 operated on backup power and the acknowledgements identify the last step of the power loss procedure completed by the SSD controller 101. If the SSD controller 101 is unable to store all critical information (i.e. the acknowledged write commands in the channel command queue, acknowledged write commands in command queue, or L2P update log), when the SSD controller 101 powers up at step 521, the SSD controller 101 will be in a failed state. Thus, the SSD controller 101 may not be able to perform some or all of steps 525, 527 and 529 (represented by dashed lines).

Although method steps 500 describe a power circuit as detecting a loss of power from a host device and switching to a backup power source 115, either the SSD controller 101 or the secondary controller 107 could be configured to perform this step. Additionally, the secondary controller 107 can be further configured to detect the backup power source 115 below a predefined threshold and apply RESET to the SSD controller 101.

Implementing method steps 500 for an SSD with PLP allows for an accurate measurement of the time for which the primary controller 101 operates on backup power along with an indication of the steps of the power loss procedure that the primary controller 101 was able to perform.

Other objects, advantages and embodiments of the various aspects of the present invention will be apparent to those who are skilled in the field of the invention and are within the scope of the description and the accompanying Figures. For example, but without limitation, structural or functional elements might be rearranged, or method steps reordered, consistent with the present invention. Similarly, principles according to the present invention could be applied to other examples, which, even if not specifically described here in detail, would nevertheless be within the scope of the present invention.

What is claimed is:

1. A solid state drive (SSD) comprising:
a primary controller operable at a first minimum operable voltage;
a secondary controller operable at a second minimum operable voltage that is less than the first minimum operable voltage; and
a power circuit configured to supply power to the primary controller and the secondary controller from a power source during normal operation of the SSD and from a backup power source in response to a loss of power supplied by the power source, wherein
the secondary controller is configured to track a time from the loss of power supplied by the power source to a reset of the primary controller,
wherein the primary controller is not operable at a supply voltage below the first minimum operable voltage, and the secondary controller is operable at the supply voltage below the first minimum operable voltage.

2. The SSD of claim 1, wherein a host device comprises the power source.

3. The SSD of claim 1, wherein the backup power source comprises a capacitor or a battery.

4. The SSD of claim 1, wherein
the loss of power comprises the power source falling below a first predefined threshold; and
the reset of the primary controller occurs in response to the backup power source falling below a second predefined threshold.

5. The SSD of claim 4, wherein the secondary controller is further configured to detect the power source falling below the first predefined threshold and the backup power source falling below the second predefined threshold.

6. The SSD of claim 4, wherein the second voltage is less than the second predefined threshold.

7. The SSD of claim 1, wherein the secondary controller further comprises a timer to track the time.

8. The SSD of claim 7, further comprising a non-volatile memory operable at the second minimum operable voltage in communication with the secondary controller, and the secondary controller is further configured to track the time by causing a bit to be stored in the non-volatile memory at predefined time intervals.

9. The SSD of claim 8, wherein the secondary controller is further configured to cause the time to be stored in the non-volatile memory at predefined time intervals after the loss of power.

10. The SSD of claim 1, further comprising a volatile memory in communication with the primary controller and a second non-volatile memory in communication with the primary controller, and the primary controller further configured to transfer critical information from the volatile memory to the second non-volatile memory in response to a loss of power.

11. The SSD of claim 10, wherein the critical information comprises a logical to physical address update log.

12. The SSD of claim 1, further comprising a non-volatile memory that is a component of the secondary controller.

13. A method of power loss protection (PLP) for a solid state drive (SSD), the method comprising:
supplying power from a power source during normal operation of the SSD and from a backup power source in response to a loss of power supplied by the power source;
supplying power to a primary controller operable at a first minimum operable voltage, a secondary controller and a non-volatile memory operable at a second minimum operable voltage that is less than the first minimum operable voltage, the non-volatile memory being in communication with the secondary controller; and
tracking a time from the loss of power to a reset of the primary controller,
wherein the primary controller is not operable at a supply voltage below the first minimum operable voltage, and the secondary controller is operable at the supply voltage below the first minimum operable voltage.

14. The method of claim 13, further comprising supplying backup power from a capacitor or a battery.

15. The method of claim 13, further comprising detecting the power source falling below a first predefined threshold.

16. The method of claim 13, further comprising detecting the backup power source falling below a second predefined threshold.

17. The method of claim 13, further comprising storing an indication of the tracked time at predefined time intervals.

18. The method of claim 13, further comprising storing critical information in response to the loss of power in a second non-volatile memory in communication with the primary controller.

19. The method of claim 13, further comprising storing an L2P update log in response to the loss of power.

20. The method of claim 13, further comprising storing the tracked time after regaining power from the power source.

* * * * *